(12) United States Patent
Hornung et al.

(10) Patent No.: US 11,069,458 B2
(45) Date of Patent: Jul. 20, 2021

(54) ELECTRICAL CABLE

(71) Applicant: TE CONNECTIVITY CORPORATION, Berwyn, PA (US)

(72) Inventors: Craig Warren Hornung, Harrisburg, PA (US); Chad William Morgan, Carneys Point, NJ (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 15/952,690

(22) Filed: Apr. 13, 2018

(65) Prior Publication Data

US 2019/0318841 A1   Oct. 17, 2019

(51) Int. Cl.

| | |
|---|---|
| *H01B 11/04* | (2006.01) |
| *H01B 11/06* | (2006.01) |
| *H01B 7/02* | (2006.01) |
| *H01B 11/00* | (2006.01) |
| *H01B 7/26* | (2006.01) |
| *H01B 7/18* | (2006.01) |
| *H05K 9/00* | (2006.01) |
| *H01B 13/06* | (2006.01) |

(Continued)

(52) U.S. Cl.
CPC ......... *H01B 7/0216* (2013.01); *H01B 7/1875* (2013.01); *H01B 7/26* (2013.01); *H01B 11/002* (2013.01); *H01B 13/0016* (2013.01); *H01B 13/0036* (2013.01); *H01B 13/06* (2013.01); *H05K 9/0098* (2013.01); *H01B 7/0275* (2013.01); *H01B 7/282* (2013.01); *H01B 7/2806* (2013.01); *H01B 7/292* (2013.01)

(58) Field of Classification Search
CPC .............................. H01B 11/04; H01B 11/06
USPC ................................................ 174/113 R, 36
See application file for complete search history.

(56) References Cited

U.S. PATENT DOCUMENTS 3,340,353 A * 9/1967 Mildner ................. H01B 7/202
156/54
3,439,111 A    4/1969 Miracle et al.
(Continued)

FOREIGN PATENT DOCUMENTS

CN    201327733    10/2009
CN    201359878    12/2009
(Continued)

OTHER PUBLICATIONS

Co-pending U.S. Appl. No. 15/925,243, filed Mar. 19, 2018.
(Continued)

*Primary Examiner* — Chau N Nguyen

(57) ABSTRACT

An electrical cable includes a conductor assembly having a first conductor, a second conductor and an insulator surrounding the first conductor and the second conductor. The insulator has an outer surface and extends along a longitudinal axis for a length of the electrical cable. The conductor assembly has a coating layer on the outer surface of the insulator being conductive defining an inner electrical shield of the electrical cable. A cable shield is wrapped around the conductor assembly and has an inner edge and an outer edge. The outer edge is wrapped over the inner edge to form a flap covering the inner edge and extending along the longitudinal axis. The cable shield engages the inner electrical shield and forms an outer electrical shield exterior of the inner electrical shield.

22 Claims, 5 Drawing Sheets

(51) Int. Cl.
  *H01B 13/00* (2006.01)
  *H01B 7/282* (2006.01)
  *H01B 7/28* (2006.01)
  *H01B 7/29* (2006.01)

(56) References Cited

U.S. PATENT DOCUMENTS

| | | | |
|---|---|---|---|
| 4,221,926 A * | 9/1980 | Schneider | H01B 7/2825 156/212 |
| 4,596,897 A * | 6/1986 | Gruhn | H01B 7/0861 174/115 |
| 4,644,092 A * | 2/1987 | Gentry | H01B 7/0838 174/102 C |
| 5,142,100 A | 8/1992 | Vaupotic | |
| 5,329,064 A | 7/1994 | Tash et al. | |
| 5,349,133 A * | 9/1994 | Rogers | H01B 11/1025 174/106 R |
| 5,434,354 A * | 7/1995 | Baker | H01B 11/1025 174/106 R |
| 5,619,016 A | 4/1997 | Newmoyer | |
| 6,010,788 A | 1/2000 | Kebabjian et al. | |
| 6,403,887 B1 * | 6/2002 | Kebabjian | H01B 11/002 174/11 OR |
| 6,504,379 B1 * | 1/2003 | Jackson | H01B 7/0861 174/117 F |
| 6,677,518 B2 | 1/2004 | Hirakawa et al. | |
| 7,314,998 B2 * | 1/2008 | Amato | H01B 11/1895 174/84 R |
| 7,790,981 B2 | 9/2010 | Vaupotic et al. | |
| 7,827,678 B2 | 11/2010 | Dion et al. | |
| 7,999,185 B2 | 8/2011 | Cases et al. | |
| 8,378,217 B2 | 2/2013 | Sugiyama et al. | |
| 8,381,397 B2 | 2/2013 | Dion et al. | |
| 8,440,910 B2 | 5/2013 | Nonen et al. | |
| 8,546,691 B2 | 10/2013 | Watanabe et al. | |
| 8,552,291 B2 | 10/2013 | Lingambudi et al. | |
| 8,575,488 B2 | 11/2013 | Sugiyama et al. | |
| 8,674,228 B2 | 3/2014 | Dion et al. | |
| 8,866,010 B2 | 10/2014 | Nonen et al. | |
| 8,981,216 B2 | 3/2015 | Grant et al. | |
| 8,993,883 B2 | 3/2015 | Kumakura et al. | |
| 9,064,621 B2 | 6/2015 | Kodama et al. | |
| 9,087,630 B2 * | 7/2015 | Camp, II | H01B 11/06 |
| 9,117,572 B2 | 8/2015 | Fukasaku | |
| 9,123,452 B2 | 9/2015 | Sugiyama et al. | |
| 9,123,457 B2 | 9/2015 | Kaga et al. | |
| 9,136,042 B2 | 9/2015 | Sugiyama et al. | |
| 9,142,333 B2 | 9/2015 | Kaga et al. | |
| 9,159,472 B2 | 10/2015 | Nordin et al. | |
| 9,214,260 B2 * | 12/2015 | Ishikawa | H01B 7/30 |
| 9,299,481 B2 | 3/2016 | Ishikawa et al. | |
| 9,349,508 B2 | 5/2016 | Nonen et al. | |
| 9,350,571 B2 | 5/2016 | Watanabe et al. | |
| 9,466,408 B2 | 10/2016 | Sugiyama | |
| 9,484,127 B2 | 11/2016 | Sugiyama et al. | |
| 9,496,071 B2 | 11/2016 | Nagagashi | |
| 9,548,143 B2 | 1/2017 | Sugiyama et al. | |
| 9,583,235 B2 | 2/2017 | Nonen et al. | |
| 9,660,318 B2 | 5/2017 | Sugiyama et al. | |
| 2003/0150633 A1 | 8/2003 | Hirakawa et al. | |
| 2005/0011664 A1 * | 1/2005 | Lee | H01B 11/1033 174/102 SC |
| 2006/0254801 A1 | 11/2006 | Stevens | |
| 2007/0037419 A1 * | 2/2007 | Sparrowhawk | H01B 11/1008 439/98 |
| 2009/0324982 A1 * | 12/2009 | Aramaki | B22F 7/04 428/548 |
| 2010/0307790 A1 | 12/2010 | Okano | |
| 2011/0083877 A1 * | 4/2011 | Sugiyama | H01B 7/0823 174/115 |
| 2011/0100682 A1 | 5/2011 | Nonen et al. | |
| 2011/0127062 A1 | 6/2011 | Cases et al. | |
| 2012/0024566 A1 | 2/2012 | Shimosawa et al. | |
| 2012/0080211 A1 * | 4/2012 | Brown | H01B 11/06 174/34 |
| 2012/0152589 A1 | 6/2012 | Kumakura et al. | |
| 2012/0227998 A1 | 9/2012 | Lindstrom et al. | |
| 2013/0175081 A1 | 7/2013 | Watanabe et al. | |
| 2013/0333913 A1 * | 12/2013 | Nonen | H01B 11/085 174/34 |
| 2014/0048302 A1 | 2/2014 | Nonen et al. | |
| 2014/0102783 A1 | 4/2014 | Nagahashi et al. | |
| 2014/0305676 A1 | 10/2014 | Sugiyama et al. | |
| 2014/0318859 A1 * | 10/2014 | Van Rens | H01B 7/048 174/70 R |
| 2015/0000954 A1 | 1/2015 | Nonen et al. | |
| 2015/0255928 A1 | 9/2015 | Liptak et al. | |
| 2016/0111187 A1 | 4/2016 | Kodama | |
| 2016/0155540 A1 * | 6/2016 | Matsuda | H01B 11/183 174/107 |
| 2016/0300642 A1 | 10/2016 | Kodama et al. | |
| 2016/0343474 A1 * | 11/2016 | Nichols | H01B 11/20 |
| 2016/0372235 A1 | 12/2016 | Sugiyama et al. | |
| 2017/0103830 A1 | 4/2017 | Dettmer et al. | |
| 2018/0096755 A1 | 4/2018 | Tsujino et al. | |

FOREIGN PATENT DOCUMENTS

| | | |
|---|---|---|
| CN | 102231303 | 11/2011 |
| CN | 203931605 | 11/2014 |
| CN | 105741965 | 7/2016 |
| JP | 2000040423 | 2/2000 |
| JP | 2001093357 | 4/2001 |
| JP | 2012009321 | 1/2012 |
| JP | 2012238468 | 12/2012 |
| JP | 2013038082 | 2/2013 |
| JP | 2013258009 | 12/2013 |
| JP | 2014038802 | 2/2014 |
| JP | 2014078339 | 5/2014 |
| JP | 2014099404 | 5/2014 |
| JP | 2014142247 | 8/2014 |
| JP | 2014154490 | 8/2014 |
| JP | 2014157709 | 8/2014 |
| JP | 2015076138 | 4/2015 |
| JP | 2015146298 | 8/2015 |
| JP | 2015204195 | 11/2015 |
| JP | 2015230836 | 12/2015 |
| JP | 2016015255 | 1/2016 |
| JP | 2016027547 | 2/2016 |
| JP | 2016072007 | 5/2016 |
| JP | 2016072196 | 5/2016 |
| JP | 2016110960 | 6/2016 |
| JP | 2016213111 | 12/2016 |
| WO | 96041351 | 12/1996 |

OTHER PUBLICATIONS

Co-pending U.S. Appl. No. 15/925,265, filed Mar. 19, 2018.
Co-pending U.S. Appl. No. 15/969,264, filed May 2, 2018.
Co-pending U.S. Appl. No. 16/159,003, filed Oct. 12, 2018.
Co-pending U.S. Appl. No. 16/159,053, filed Oct. 12, 2018.

* cited by examiner

ELECTRICAL CABLE

BACKGROUND OF THE INVENTION

The subject matter herein relates generally to signal transmission electrical cables and shielding efficiency for signal conductors.

Shielded electrical cables are used in high-speed data transmission applications in which electromagnetic interference (EMI) and/or radio frequency interference (RFI) are concerns. Electrical signals routed through shielded cables radiate less EMI/RFI emissions to the external environment than electrical signals routed through non-shielded cables. In addition, the electrical signals being transmitted through the shielded cables are better protected against interference from environmental sources of EMI/RFI than signals through non-shielded cables.

Shielded electrical cables are typically provided with a cable shield formed by a tape wrapped around the conductor assembly. Signal conductors are typically arranged in pairs conveying differential signals. The signal conductors are surrounded by an insulator and the cable shield is wrapped around the insulator. However, where the cable shield overlaps itself, an air void is created. The air void affects the electrical performance of the conductors in the electrical cable by changing the dielectric constant of the material near one of the conductors compared to the other of the conductors within the differential pair, leading to electrical signal timing skew.

A need remains for an electrical cable that improves signal performance.

BRIEF DESCRIPTION OF THE INVENTION

In an embodiment, an electrical cable is provided including a conductor assembly having a first conductor, a second conductor and an insulator surrounding the first conductor and the second conductor. The insulator has an outer surface and extends along a longitudinal axis for a length of the electrical cable. The conductor assembly has a coating layer on the outer surface of the insulator being conductive defining an inner electrical shield of the electrical cable. A cable shield is wrapped around the conductor assembly and has an inner edge and an outer edge. The outer edge is wrapped over the inner edge to form a flap covering the inner edge and extending along the longitudinal axis. The cable shield engages the inner electrical shield and forms an outer electrical shield exterior of the inner electrical shield.

In another embodiment, an electrical cable is provided including a conductor assembly having a first conductor, a second conductor and an insulator surrounding the first conductor and the second conductor. The insulator has an outer surface and extends along a longitudinal axis for a length of the electrical cable. The conductor assembly has a coating layer on the outer surface of the insulator being conductive defining an inner electrical shield of the electrical cable. The coating layer includes a plurality of disparate coating sections electrically separated by cracks. A cable shield is wrapped around the conductor assembly and has an inner edge and an outer edge. The outer edge is wrapped over the inner edge to form a flap covering the inner edge and extending along the longitudinal axis. The cable shield engages the inner electrical shield and forms an outer electrical shield exterior of the inner electrical shield. The outer electrical shield covers the cracks.

In a further embodiment, an electrical cable is provided including a conductor assembly having a first conductor, a second conductor and an insulator surrounding the first conductor and the second conductor. The insulator has an outer surface and extends along a longitudinal axis for a length of the electrical cable. The conductor assembly has a coating layer on the outer surface of the insulator being conductive defining an inner electrical shield of the electrical cable. The coating layer includes conductive ink particles applied to the insulator cured to form the coating layer. A cable shield is wrapped around the conductor assembly and has an inner edge and an outer edge. The outer edge is wrapped over the inner edge to form a flap covering the inner edge and extending along the longitudinal axis. The cable shield engages the inner electrical shield and forms an outer electrical shield exterior of the inner electrical shield.

DETAILED DESCRIPTION OF THE INVENTION

Figure 1:
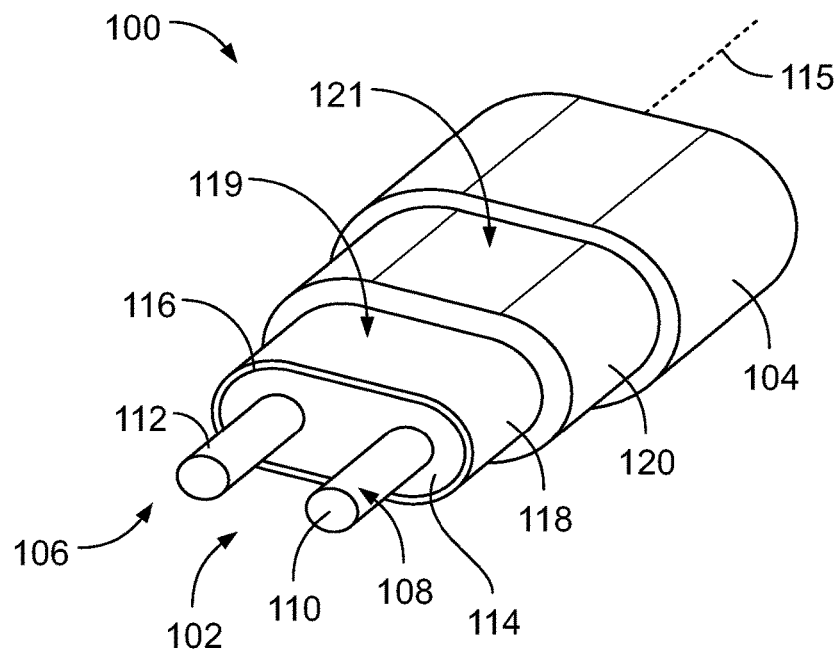
FIG. 1 is a perspective view of a portion of an electrical cable formed in accordance with an embodiment.

FIG. 1 is a perspective view of a portion of an electrical cable 100 formed in accordance with an embodiment. The electrical cable 100 may be used for high speed data transmission between two electrical devices, such as electrical switches, routers, and/or host bus adapters. The electrical cable 100 has a shielding structure configured to control capacitance and inductance relative to the signal conductors to control signal skew in the electrical cable 100 for high speed applications.

The electrical cable 100 includes a conductor assembly 102. The conductor assembly 102 is held within an outer jacket 104 of the electrical cable 100. The outer jacket 104 surrounds the conductor assembly 102 along a length of the conductor assembly 102. In FIG. 1, the conductor assembly 102 is shown protruding from the outer jacket 104 for clarity in order to illustrate the various components of the conductor assembly 102 that would otherwise be obstructed by the outer jacket 104. It is recognized, however, that the outer jacket 104 may be stripped away from the conductor assembly 102 at a distal end 106 of the cable 100, for example, to allow for the conductor assembly 102 to terminate to an electrical connector, a printed circuit board, or the like.

The conductor assembly 102 includes inner conductors arranged in a pair 108 that are configured to convey data signals. In an exemplary embodiment, the pair 108 of conductors defines a differential pair conveying differential signals. The conductor assembly 102 includes a first conductor 110 and a second conductor 112. In an exemplary embodiment, the conductor assembly 102 is a twin-axial differential pair conductor assembly. The conductors 110, 112 extend the length of the electrical cable 100 along a longitudinal axis 115.

The conductor assembly 102 includes an insulator 114 surrounding the conductors 110, 112. The insulator 114 is a monolithic, unitary insulator structure having an outer surface 116. In other various embodiments, the conductor assembly 102 may include first and second insulators surrounding the first and second conductors 110, 112, respectively, which are separate, discrete components sandwiched together in the cable core of the electrical cable 100.

The conductor assembly 102 includes a coating layer 118 on the outer surface 116 of the insulator 114. The coating layer 118 is conductive and defines an inner electrical shield 119 of the electrical cable 100. The coating layer 118 provides circumferential shielding around the pair 108 of conductors 110, 112 along the length of the electrical cable 100. In an exemplary embodiment, the coating layer 118 is applied directly to the outer surface 116. The coating layer 118 engages the outer surface 116. As used herein, two components "engage" or are in "engagement" when there is direct physical contact between the two components. The coating layer 118 is a direct metallization shield structure on the outer surface 116 of the insulator 114. The coating layer 118 conforms to the shape of the insulator 114 around the entire outer surface 116. The coating layer 118 is seamless along the length of the electrical cable 100. For example, the coating layer 118 does not include any seams or air gaps that are common with longitudinal or helical wraps. In an exemplary embodiment, the coating layer 118 is homogenous through a thickness of the coating layer 118. For example, the coating layer 118 may include conductive ink particles applied to the insulator 114, such as during an ink printing or other ink applying process. The conductive ink particles may be cured to form a homogenous coating layer. The coating layer 118 may include metal particles sprayed on the insulator 114, such as through a thermal spraying process. The coating layer 118 may be applied by other processes, such as a physical vapor deposition (PVD) process. The coating layer 118 may be applied in multiple passes or layers to thicken the coating layer 118. The coating layer 118 may be plated to build up the coating layer 118 on the insulator 114 in various embodiments.

The conductor assembly 102 includes a cable shield 120 surrounding the insulator 114 and the coating layer 118. The cable shield 120 forms an outer electrical shield 121 that provides electrical shielding for the conductors 110, 112. The outer electrical shield 121 is exterior of the inner electrical shield 119. The outer electrical shield 121 may engage the coating layer 118. In various embodiments, the outer electrical shield 121 is electrically connected to the inner electrical shield 119. The cable shield 120 provides circumferential shielding around the pair 108 of conductors 110, 112 along the length of the electrical cable 100.

The conductors 110, 112 extend longitudinally along the length of the cable 100. The conductors 110, 112 are formed of a conductive material, for example a metal material, such as copper, aluminum, silver, or the like. Each conductor 110, 112 may be a solid conductor or alternatively may be composed of a combination of multiple strands wound together. The conductors 110, 112 extend generally parallel to one another along the length of the electrical cable 100.

The insulator 114 surrounds and engages outer perimeters of the corresponding first and second conductors 110, 112. The insulator 114 is formed of a dielectric material, for example one or more plastic materials, such as polyethylene, polypropylene, polytetrafluoroethylene, or the like. The insulator 114 may be formed directly to the inner conductors 110, 112 by a molding process, such as extrusion, overmolding, injection molding, or the like. In an exemplary embodiment, the insulator 114 is coextruded with both conductors 110, 112. The insulator 114 extends between the conductors 110, 112 and the cable shield 120. The insulator 114 maintains the conductor to conductor spacing and the conductor to shield spacing. For example, the insulator 114 separates or spaces the conductors 110, 112 from one another and separates or spaces the conductors 110, 112 from the inner electrical shield 119 and/or the outer electrical shield 121. The insulator 114 maintains separation and positioning of the conductors 110, 112 along the length of the electrical cable 100. The size and/or shape of the conductors 110, 112, the size and/or shape of the insulators 114, 116, and the relative positions of the conductors 110, 112 may be modified or selected in order to attain a particular impedance and/or capacitance for the electrical cable 100. For example, the conductors 110, 112 may be moved relatively closer or relatively further from each other to affect electrical characteristics of the electrical cable 100. The inner electrical shield 119 may be moved relatively closer or relatively further from the conductors 110, 112 to affect electrical characteristics of the electrical cable 100.

The cable shield 120 surrounds the coating layer 118 and the insulator 114. The cable shield 120 is formed, at least in part, of a conductive material. In an exemplary embodiment, the cable shield 120 is a tape configured to be wrapped around the cable core. For example, the cable shield 120 may include a multi-layer tape having a conductive layer and an insulating layer, such as a backing layer. The conductive layer and the backing layer may be secured together by adhesive. Optionally, the cable shield 120 may include an adhesive layer, such as along the interior side to secure the cable shield 120 to the insulators 114, 116 and/or itself. The conductive layer may be a conductive foil or another type of conductive layer. The insulating layer may be a polyethylene terephthalate (PET) film, or similar type of film. The conductive layer provides electrical shielding for the first and second conductors 110, 112 from external sources of EMI/RFI interference and/or to block cross-talk between other conductor assemblies 102 or electrical cables 100. In an exemplary embodiment, the electrical cable 100 includes a wrap or another layer around the cable shield 120 that holds the cable shield 120 on the insulators 114, 116. For example, the electrical cable 100 may include a helical wrap. The wrap may be a heat shrink wrap. The wrap is located inside the outer jacket 104.

The outer jacket 104 surrounds and may engage the outer perimeter of the cable shield 120 or the heat shrink wrap. In the illustrated embodiment, the outer jacket 104 engages the cable shield 120 along substantially the entire periphery of the cable shield 120. The outer jacket 104 is formed of at least one dielectric material, such as one or more plastics (for example, vinyl, polyvinyl chloride (PVC), acrylonitrile butadiene styrene (ABS), or the like). The outer jacket 104 is non-conductive, and is used to insulate the cable shield 120 from objects outside of the electrical cable 100. The outer jacket 104 also protects the cable shield 120 and the other internal components of the electrical cable 100 from mechanical forces, contaminants, and elements (such as fluctuating temperature and humidity). Optionally, the outer jacket 104 may be extruded or otherwise molded around the cable shield 120. Alternatively, the outer jacket 104 may be wrapped around the cable shield 120 or heat shrunk around the cable shield 120.

Figure 2:
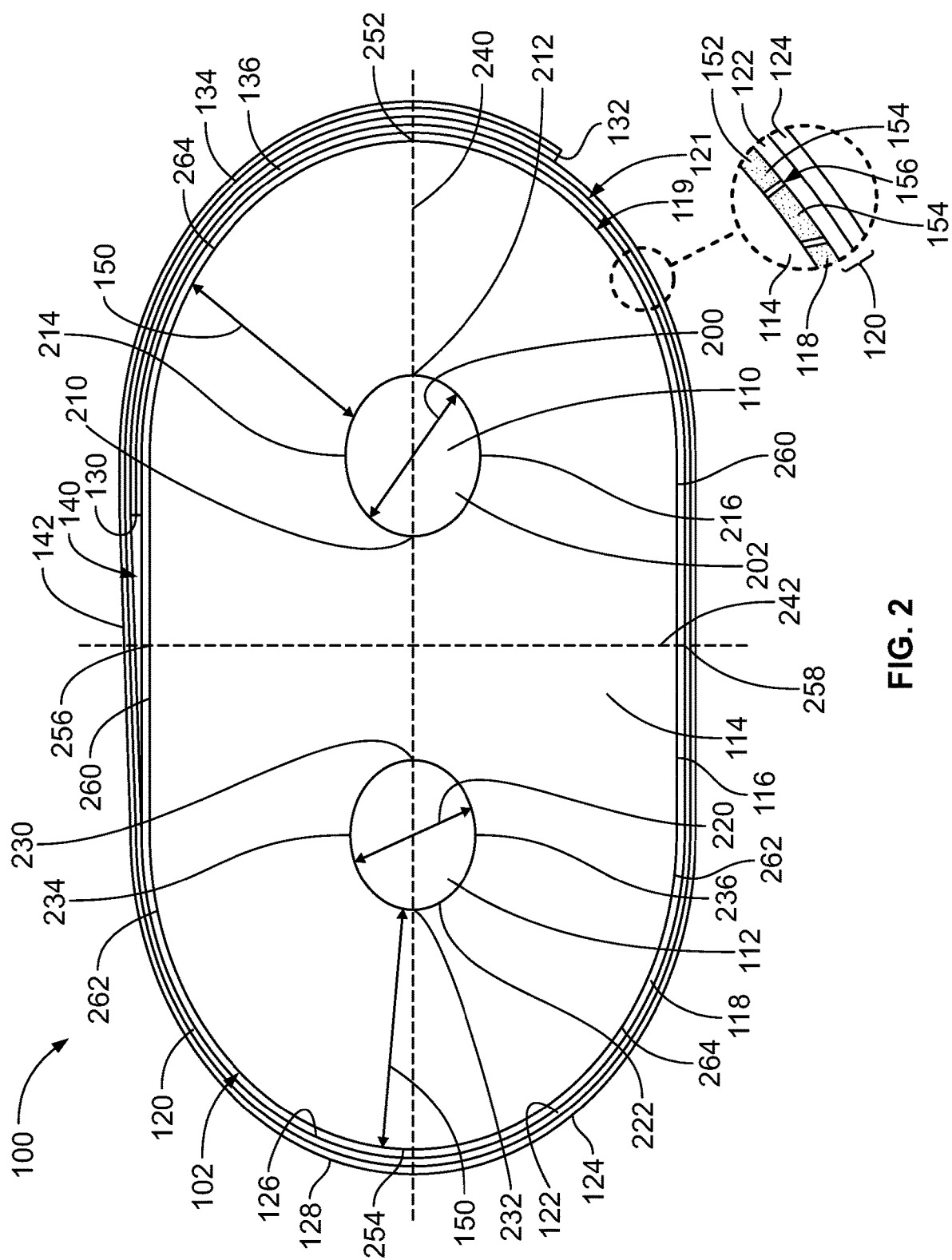
FIG. 2 is a cross-sectional view of the conductor assembly in accordance with an exemplary embodiment.

FIG. 2 is a cross-sectional view of the conductor assembly 102 in accordance with an exemplary embodiment. The coating layer 118 is a direct metallization of the insulator 114 by applying the shield structure directly to the outer surface 116 of the insulator 114. The cable shield 120 is then wrapped around the coating layer 118 and the insulator 114 in the cable core as a secondary shield structure. The cable shield 120 may provide another layer of shielding for the electrical cable 100, such as for shielding over cracks or breaks in the coating layer 118, which may form over time due to bending of the electrical cable or wear over time. The cable shield 120 may be electrically connected to the coating layer 118, thus electrically connecting pieces or segments of the coating layer 118 that may be separated by such cracks or breaks.

The cable shield 120 includes a conductive layer 122 and an insulating layer 124. In the illustrated embodiment, the conductive layer 122 is provided on an interior 126 of the cable shield 120 and the insulating layer 124 is provided on an exterior 128 of the cable shield 120 such that the conductive layer 122 may engage and be electrically connected to the coating layer 118. However, the conductive layer 122 may be provided on the exterior of the cable shield 120 in alternative embodiments.

The cable shield 120 includes an inner edge 130 and an outer edge 132. When the cable shield 120 is wrapped around the cable core, a flap 134 of the cable shield 120 overlaps the inner edge 130 and a segment 136 of the cable shield 120. The interior 126 of the flap 134 may be secured to the exterior 128 of the segment 136 along a seam, such as using adhesive or a heat shrink wrap around the entire cable shield 120. The interior 126 of portions of the cable shield 120 may be secured directly to the coating layer 118. When the cable shield 120 is wrapped over itself to form the flap 134, a void 140 is created. The cable shield 120 may be wrapped such that the flap 134 is at the top and wrapping to the right side as in the illustrated embodiment. However, the cable shield 120 may be wrapped in other directions in alternative embodiments or at other positions in alternative embodiments.

The void 140 is created at the seam side of the electrical cable 100. In various embodiments, the void 140 is a pocket of air defined between the interior 126 of an elevated segment 142 of the cable shield 120 and the coating layer 118 on the insulator 114. In other various embodiments, the void 140 may be filled with another material, such as adhesive or other dielectric material. The elevated segment 142 is elevated or lifted off of the insulator 114 to allow the flap 134 to clear the inner edge 130. Without the inner electrical shield 119 interior of, and thus between the void 140 and the conductors 110, 112, the volume of the air in the void 140 would affect the electrical characteristics of the conductors 110, 112 by changing the dielectric constant of the dielectric material between the conductive layer 122 of the cable shield 120 and the corresponding conductors 110, 112. However, by positioning the coating layer 118 on the outer surface 116 of the insulator 114, and thus positioning the coating layer 118 interior of the void 140, the effect of the void is reduced and/or eliminated.

In conventional electrical cables without the inner electrical shield 119, the air in the void 140 leads to a skew imbalance for one of the conductors, such as the first conductor 110 or the second conductor 112, because the void 140 is offset on one side or the other of the conductor assembly 102. The void in conventional electrical cables changes the dielectric constant of the dielectric material around the first conductor 110 compared to the second conductor 112 leading to skew imbalance. For example, signals transmitted by the first conductor 110 may be transmitted faster than the signals transmitted by the second conductor 112, leading to skew in the differential pair in conventional electrical cables. However, the inclusion of the coating layer 118 mitigates the effects of the air void 140 by positioning the shield structure of the electrical cable 100 interior of the air void 140. The distance between the conductors 110, 112 and the shield structure is maintained more uniformly around the electrical cable 100 by having the inner electrical shield 119 surrounding the insulator 114.

Optionally, the electrical cable 100 may be manufactured to reduce skew imbalance by locating the void 140 between the first and second conductors 110, 112. For example, the location of the void 140 may be selected to completely balance the skew effects of the void 140 on the first conductor 110 and on the second conductor 112 leading to a zero skew or near-zero skew effect. For example, the void 140 may be approximately centered between the first and second conductors 110, 112. Optionally, due to the shape of the void 140, the void 140 may be off-set from centered above the first and second conductors 110, 112, such as with the volumes of air in the void 140 being approximately centered between the first and second conductors 110, 112.

The coating layer 118 is conductive and defines a shield structure for the first and second conductors 110, 112. The coating layer 118 provides circumferential shielding around the pair 108 of conductors 110, 112, such as at a shield distance 150 between the conductors 110, 112 and the inner electrical shield 119, which is defined by a thickness of the insulator 114. For example, in an exemplary embodiment, the coating layer 118 is applied directly to the outer surface 116 and thus the shield distance 150 is defined by the thickness of the insulator 114. The shield distance 150 may be variable around the conductor assembly 102, such as due to the shape of the outer surface 116 and the positioning of the conductors 110, 112 within the insulator 114. The coating layer 118 conforms to the shape of the insulator 114 around the entire outer surface 116 and does not include air voids between the coating layer 118 and the outer surface 116. The direct metallization of the outer surface 116 of the insulator 114, which is defined by the coating layer 118, positions the shield structure interior of the air void 140 and at more uniform shield spacing from the conductors 110, 112. The coating layer 118 forms a conductive shell around the insulator 114 prior to wrapping the cable shield 120 around the cable core.

In an exemplary embodiment, the coating layer 118 may include conductive particles 152 applied to the insulator 114 as a continuous coating on the outer surface 116. In various embodiments, the conductive particles 152 are silver particles; however the conductive particles may be other metals or alloys in alternative embodiments. The conductive particles 152 may be initially applied with non-conductive particles, such as binder material, some or all of which may be later removed, such as during a curing, drying or other process. For example, the conductive particles 152 may be conductive ink particles applied by a printing, spraying, bathing or other application process. For example, the coating layer 118 may be a silver (or other metal, such as copper, aluminum and the like) ink coating applied to the insulator 114. The coated material may be processed, for example, cured or partially cured, to form the coating layer 118. In various embodiments, the coating layer 118 may be applied using a dipping bath, such as in a metal bath solution, and processed with IR heating in one or more passes. In various embodiments, the coating material may be dissolved metal material that is applied and cured to leave metal crystals behind as the conductive particles. In an exemplary embodiment, the coating layer 118 is a homogenous coating layer. The coating layer 118 may be applied in multiple passes or layers to thicken the coating layer 118. The layers may be fully cured between applications in various embodiments. The layers may be partially cured between applications in other alternative embodiments. In some embodiments, a dielectric layer (not shown) may be applied to the coating layer 118 to protect the coating layer 118 prior to wrapping the cable shield 120 around the coating layer 118.

In other various embodiments, the conductive particles 152 may be deposited by other processes. For example, the coating layer 118 may include metal particles sprayed on the insulator 114, such as through a thermal spraying process. The metal particles may be heated and/or melted and sprayed onto the outer surface 116 to form the coating layer 118. When the metal particles are sprayed, the metal particles may be embedded into the outer surface 116 to secure the particles to the insulator 114. The metal particles may be heated to fuse the metal particles together on the outer surface 116 to form a continuous layer on the outer surface 116. Other processes may be used to apply the coating layer 118 to the insulator 114, such as a physical vapor deposition (PVD) process. The coating layer 118 may be plated to build up the coating layer 118 on the insulator 114 in various embodiments.

After the coating layer 118 is applied to the insulator 114, the coating layer 118 may segregate into disparate coating sections 154. For example, cracks 156 or other breaks may form in the coating layer 118. The disparate coating sections 154 may be electrically separated by the cracks 156. For example, the cracks 156 may completely separate the disparate coating sections 154 from each other. The cracks 156 may extend entirely through the thickness of the coating layer 118. The cracks 156 may be perpendicular through the coating layer 118, thus leading to an unshielded opening through the coating layer 118. Having the cable shield 120 radially exterior of the coating layer 118, and thus covering the crack 156, reduces the effect of the unshielded opening through the coating layer 118. Some of the cracks 156 may extend transversely through the thickness at an angle and thus the outer portion of the coating layer provides electrical shielding for the crack 156. However, the cable shield 120 is positioned radially exterior of the transverse crack and thus covering the crack 156, which reduces the effect of the crack 156 through the coating layer 118. In an exemplary embodiment, the conductive layer 122 of the cable shield 120 faces and engages the disparate coating sections 154. The conductive layer 122 electrically connects the disparate coating sections 154 across the cracks 156 to electrically common the disparate coating sections 154. Thus, the inner electrical shield 119 defined by the coating layer 118 defines the primary shield structure for the first and second conductors 110, 112 and the outer electrical shield 121 defined by the cable shield 120 defines a secondary shield structure for the first and second conductors 110, 112.

In an exemplary embodiment, the first conductor 110 has a first conductor outer surface 202 having a circular cross-section of a first diameter 200. The first conductor 110 has an inner end 210 facing the second conductor 112 and an outer end 212 opposite the inner end 210. The first conductor 110 has a first side 214 (for example, a top side) and a second side 216 (for example, a bottom side) opposite the first side 214. The first and second sides 214, 216 are equidistant from the inner and outer ends 210, 212.

In an exemplary embodiment, the second conductor 112 has a second conductor outer surface 222 having a circular cross-section of a second diameter 220. The second conductor 112 has an inner end 230 facing the first conductor 110 and an outer end 232 opposite the inner end 230. The second conductor 112 has a first side 234 (for example, a top side) and a second side 236 (for example, a bottom side) opposite the first side 234. The first and second sides 234, 236 are equidistant from the inner and outer ends 230, 232.

The conductor assembly 102 extends along a lateral axis 240 bisecting the first and second conductors 110, 112, such as through the inner ends 210, 230 and the outer ends 212, 232. Optionally, the lateral axis 240 may be centered in the insulator 114. The conductor assembly 102 extends along a transverse axis 242 centered between the first and second conductors 110, 112, such as centered between the inner ends 210, 230 of the first and second conductors 110, 112. Optionally, the transverse axis 242 may be centered in the insulator 114. In an exemplary embodiment, the transverse axis 242 is located at the magnetic center of the cable core between the first and second conductors 110, 112. In an exemplary embodiment, the longitudinal axis 115 (shown in FIG. 1), the lateral axis 240 and the transverse axis 242 are mutually perpendicular axes. In an exemplary embodiment, the insulator 114 is symmetrical about the lateral axis 240 and the transverse axis 242. In an exemplary embodiment, the coating layer 118, which is applied directly to the outer surface 116 of the insulator 114, is symmetrical about the lateral axis 240 and the transverse axis 242.

In an exemplary embodiment, the outer surface 116 has a generally elliptical or oval shape defined by a first end 252, a second end 254 opposite the first end 252, a first side 256 (for example, a top side) and a second side 258 (for example, a bottom side) opposite the first side 256. The first and second sides 256, 258 may have flat sections 260 and may have curved sections 262, such as at the transitions with the first and second ends 252, 254. The first and second ends 252, 254 have curved sections 264 that transition between the first and second sides 256, 258. The material of the insulator 114 between the conductors 110, 112 and the outer surface 116 has a thickness. Optionally, the thickness may be uniform. Alternatively, the thickness may vary, such as being narrower at the first and second sides 256, 258 and being widest at the centroids of the first and second ends 252, 254.

The insulator thickness defines the shield distance 150 between the coating layer 118 and the corresponding conductors 110, 112. The shield distance 150 between the coating layer 118 and the conductors 110, 112 affects the electrical characteristics of the signals transmitted by the conductors 110, 112. For example, the shield distance 150 may affect the delay or skew of the signal, the insertion loss of the signal, the return loss of the signal, and the like. The dielectric material between the coating layer 118 and the corresponding conductors 110, 112 affects the electrical characteristics of the signals transmitted by the conductors 110, 112. Because the coating layer 118 closely follows the outer surface 116, the positioning of the coating layer 118 to the conductors 110, 112 (the shield distance 150) may be controlled within a tight tolerance by controlling manufacturing of the insulator 114 to a tight tolerance. The effects of the air void 140 are significantly reduced if not entirely eliminated by locating the coating layer 118 interior of the air void 140. Having the coating layer 118 symmetrically arranged and continuous around the circumference of the insulator 114 provides efficient shielding around the conductors 110, 112 and minimizes skew imbalance in the electrical cable 100 because the effect of the void 140 is diminished or eliminated.

When comparing the first and second conductors 110, 112, the symmetry of the insulator 114 around the conductors 110, 112 and the symmetry of the inner electrical shield 119 around the conductors 110, 112 eliminates skew imbalance in the electrical cable 100. Having the inner electrical shield 119 symmetrically positioned relative to the first and second conductors 110, 112 leads to similar capacitance of the first conductor 110 as compared to the second conductor 112. Having the insulator 114 symmetrically positioned around the first and second conductors 110, 112 leads to similar inductance of the first conductor 110 as compared to the second conductor 112. Thus, the delay (square root of inductance times capacitance) is similar or the same in the first conductor 110 as in the second conductor 112 leading to zero or near-zero skew. Having the cable shield 120 as a secondary shield structure immediately surrounding the coating layer 118 minimizes effects of any breaks or discontinuities in the primary shield structure of the coating layer 118.

Figure 3:
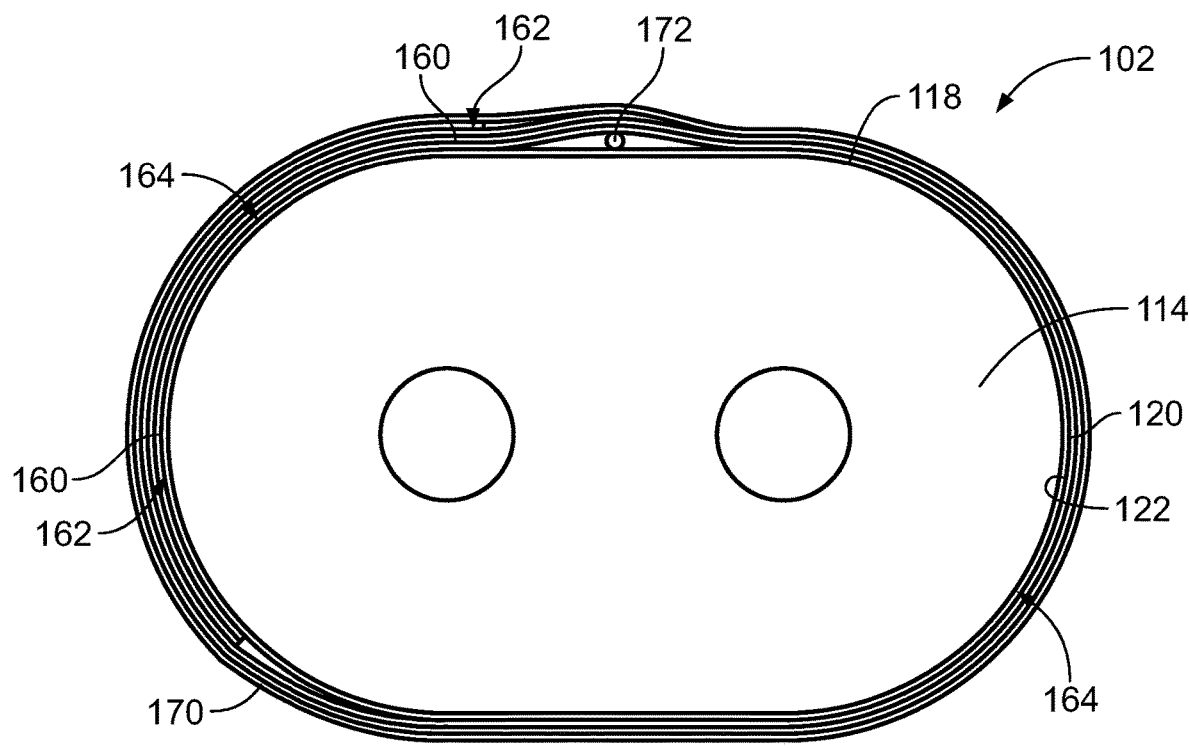
FIG. 3 is a cross-sectional view of the conductor assembly in accordance with an exemplary embodiment.

FIG. 3 is a cross-sectional view of the conductor assembly 102 in accordance with an exemplary embodiment. FIG. 3 shows adhesive 160 selectively applied to the cable shield 120 at a select adhesive area(s) 162. Other areas form non-adhesive areas 164 devoid of the adhesive 160. The adhesive 160 is used to secure the cable shield 120 on the conductor assembly 102, such as to resist rotation or relative movement between the cable shield 120 on the conductor assembly 102. At the adhesive area(s) 162, the adhesive 160 may be adhered to the coating layer 118 and/or the insulator 114. The adhesive 160 may include conductive particles to provide shielding. In the non-adhesive areas 164 devoid of the adhesive 160, the cable shield 120 may directly engage the coating layer 118, such as to electrically connect the conductive layer 122 to the coating layer 118.

In an exemplary embodiment, the conductor assembly 102 includes a seal wrap 170 wrapped around the cable shield 120. The seal wrap 170 may be helically wrapped around the cable shield 120. The seal wrap 170 may be a heat shrink wrap that may be heat shrunk around the cable shield 120 to compress against the cable shield 120. The seal wrap 170 may be used to hold the cable shield 120 on the insulator 114. The seal wrap 170 may be used to compress the cable shield 120 against the coating layer 118. For example, the seal wrap 170 may press the coating layer 122 against the coating layer 118. In various embodiments, the seal wrap 170 may be a metal seal wrap, such as a copper tape or foil. In other various embodiments, the seal wrap 170 may be a plastic seal wrap. In still other various embodiments, the seal wrap 170 may be a multi-layer wrap, such as having a conductive layer and a non-conductive layer. The jacket of the cable may surround the seal wrap 170.

In various embodiments, the conductor assembly 102 may include a drain wire 172 inside the cable shield 120. The drain wire 172 may be electrically connected to the conductive layer 122 of the cable shield 120 and/or the coating layer 118. The drain wire 172 may be arranged at the top and/or the bottom of the conductor assembly 102.

FIGS. 4-8 illustrate signal integrity charts for exemplary electrical cables in accordance with an exemplary embodiment. The signal integrity charts illustrate results for three different electrical cables, namely cable 1, cable 2 and cable 3. Cable 1 is a theoretical zero skew electrical cable. Cable 2 is an exemplary embodiment of the electrical cable 100 having the coating layer 118 and the cable shield 120. Cable 3 is an exemplary embodiment of an electrical cable without the coating layer but including the cable shield 120.

Figure 4:
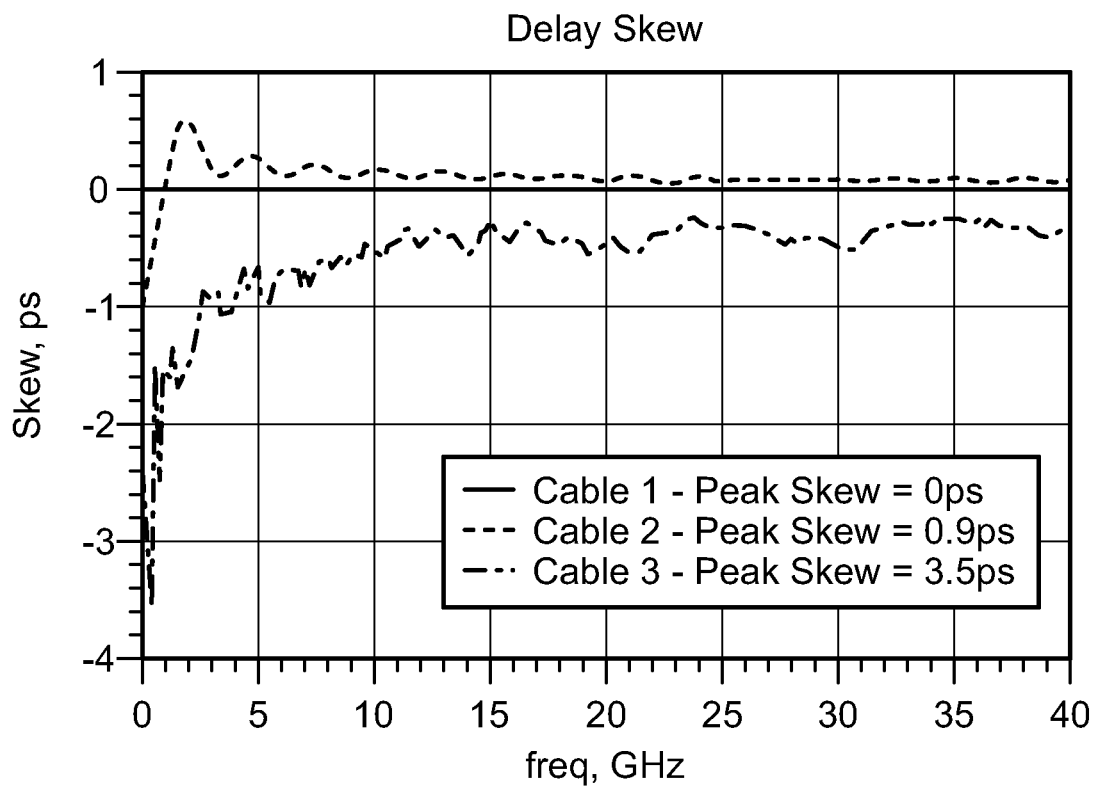
FIG. 4 is a delay skew chart showing delay skew of the exemplary electrical cables.
Figure 5:
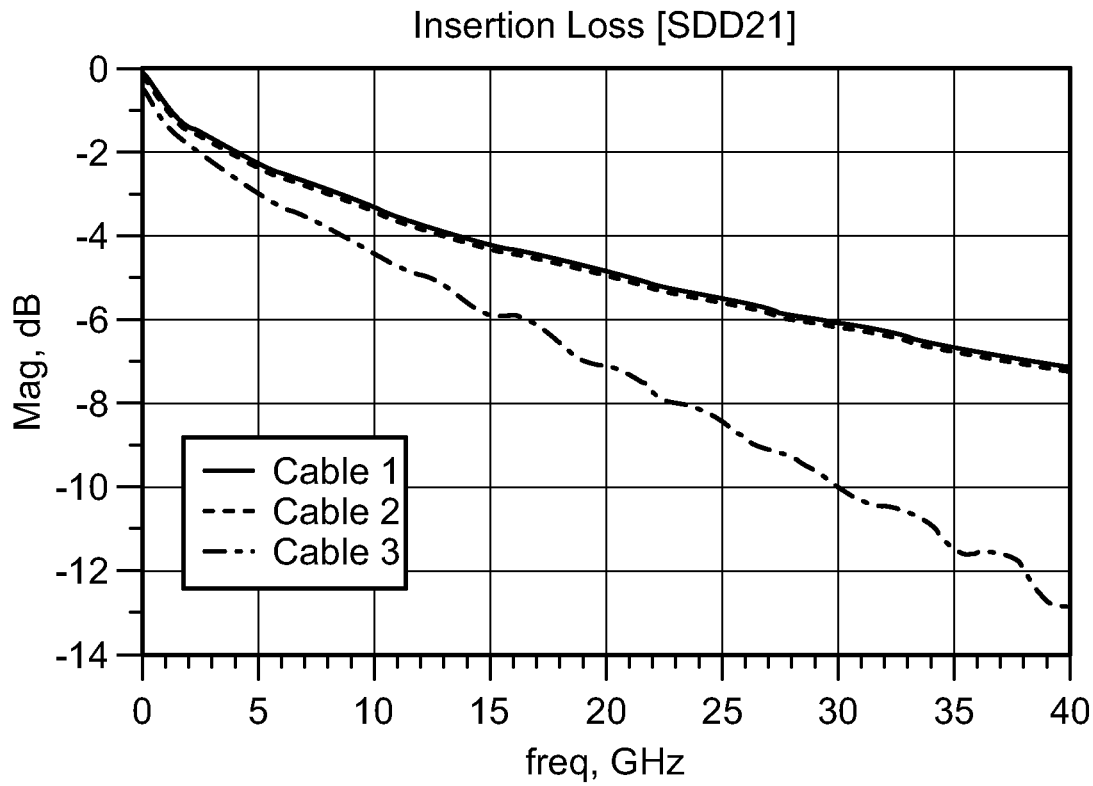
FIG. 5 is an insertion loss chart (SDD21) showing insertion loss of the exemplary electrical cables.
Figure 6:
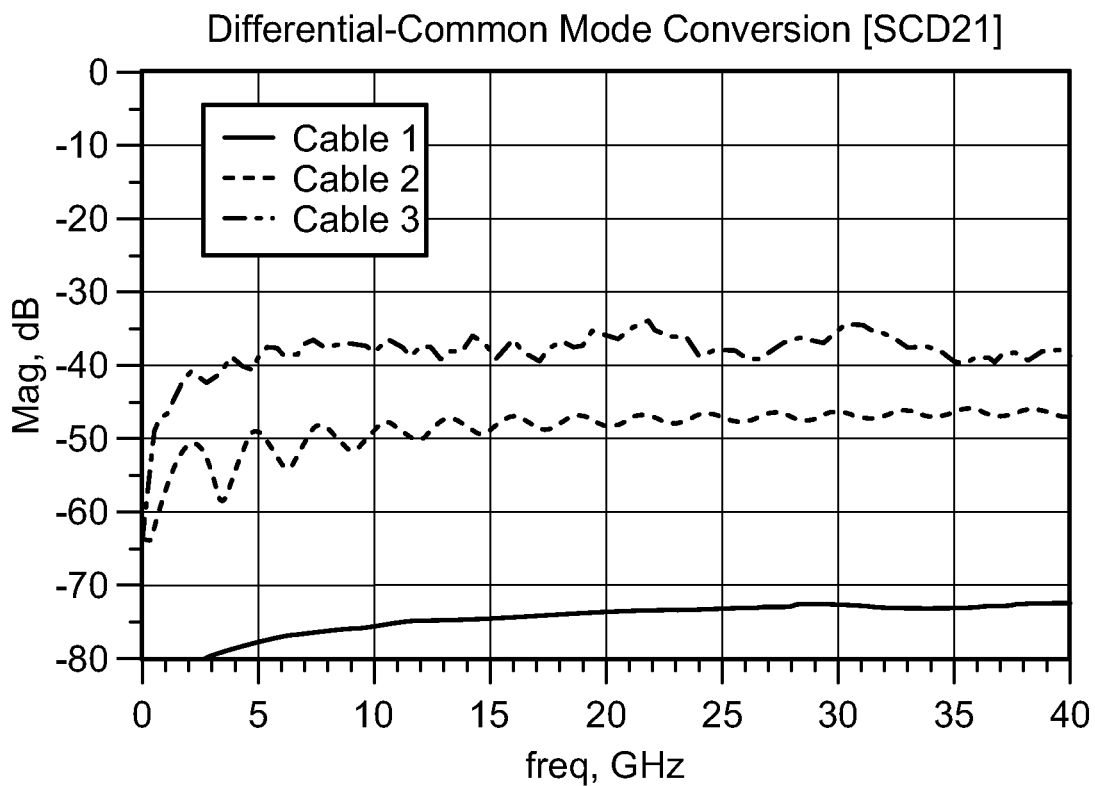
FIG. 6 is a differential-common mode conversion chart (SCD21) showing differential-common mode conversion of the exemplary electrical cables.
Figure 7:
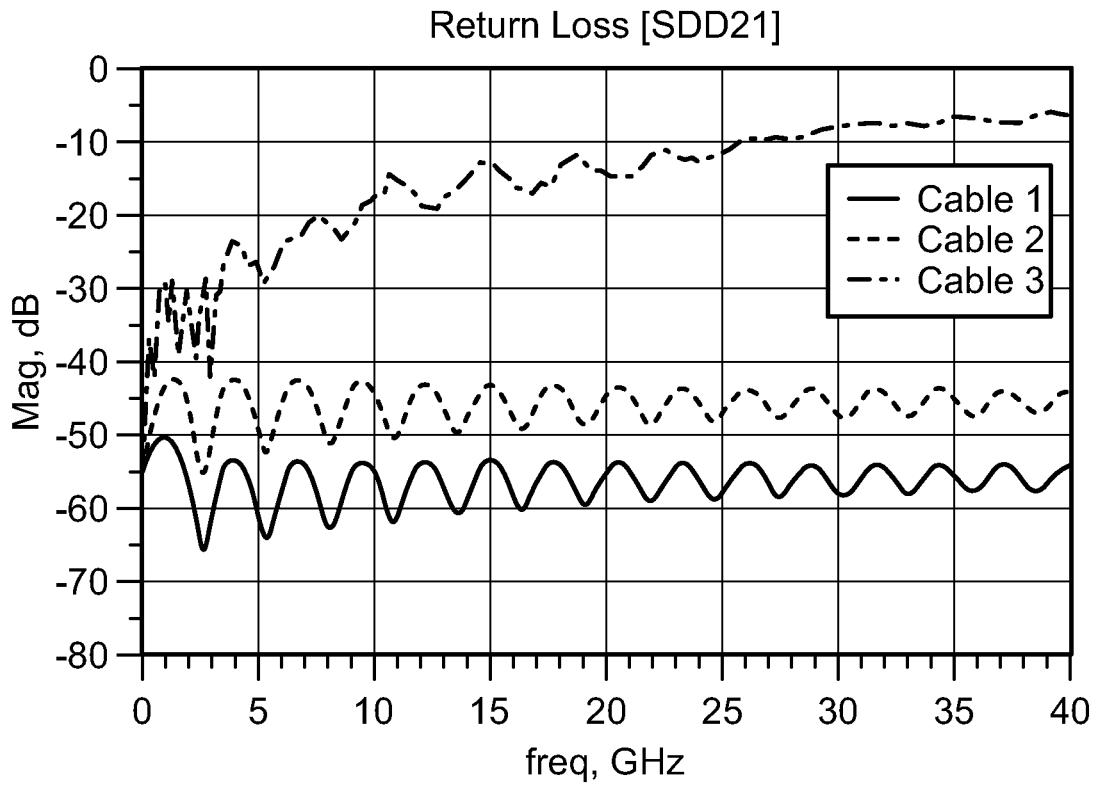
FIG. 7 is a return loss chart (SDD21) showing return loss of the exemplary electrical cables.
Figure 8:
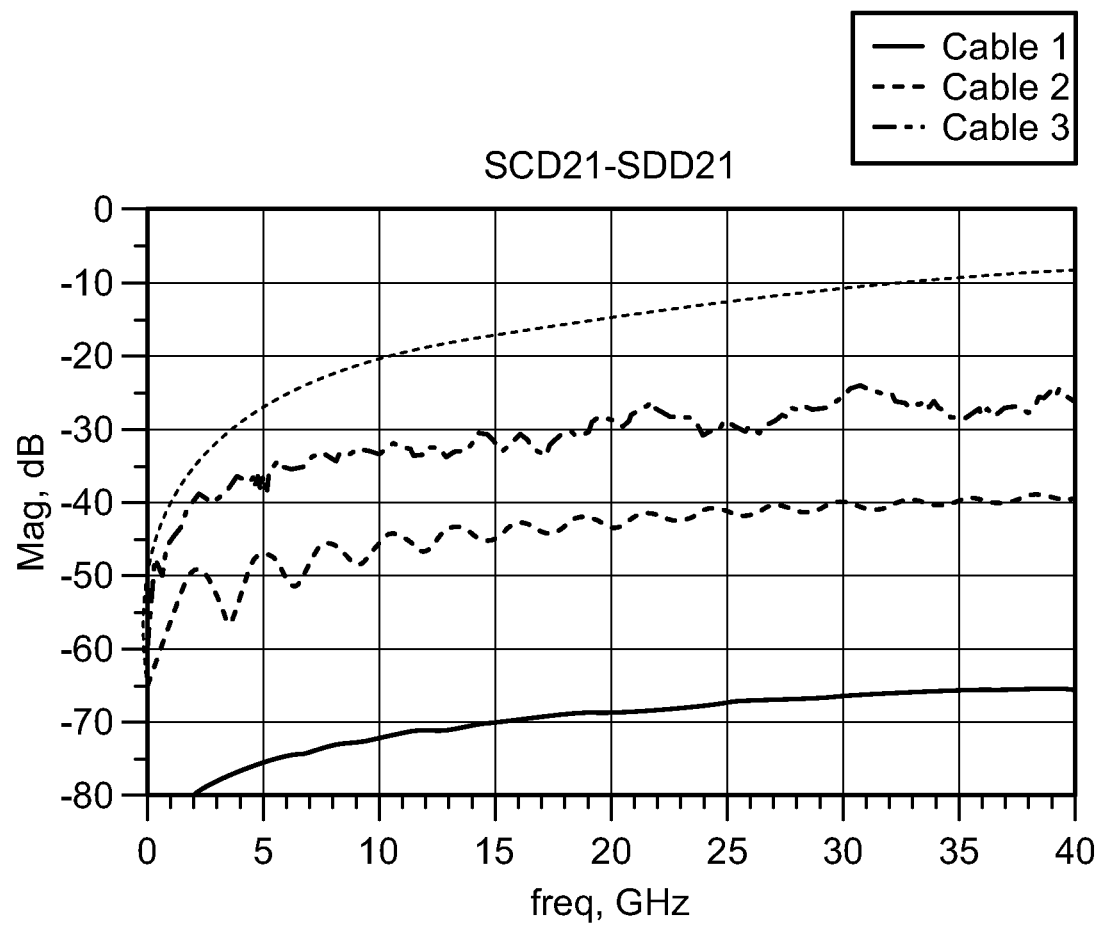
FIG. 8 is differential chart (SCD21-SDD21) chart.

FIG. 4 is a delay skew chart showing delay skew of the exemplary electrical cables. FIG. 5 is an insertion loss chart (SDD21) showing insertion loss of the exemplary electrical cables. FIG. 6 is a differential-common mode conversion chart (SCD21) showing differential-common mode conversion of the exemplary electrical cables. FIG. 7 is a return loss chart (SDD21) showing return loss of the exemplary electrical cables. FIG. 8 is differential chart (SCD21-SDD21) chart.

As shown in FIG. 4, the delay skew of the electrical cable 100 (cable 2) is near zero (which is the delay skew for cable 1) across most frequencies. The electrical cable 100 (cable 2), which includes the coating layer 118 and the cable shield 120, has improved delay skew as compared to the electrical cable (cable 3) having only the cable shield 120, which leads to improvements in insertion loss (FIG. 5), differential-common mode conversion (FIG. 6) and return loss (FIG. 7). The electrical cable 100 (cable 2), which includes the coating layer 118 and the cable shield 120, performs better than the electrical cable (cable 3) having only the cable shield 120. As shown in FIG. 5, the electrical cable 100 (cable 2) has improved insertion loss compared to the electrical cable (cable 3). As shown in FIG. 6, the electrical cable 100 (cable 2) has improved differential-mode conversion compared to the electrical cable (cable 3). As shown in FIG. 7, the electrical cable 100 (cable 2) has improved return loss compared to the electrical cable (cable 3).

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical cable comprising:
a conductor assembly having a first conductor carrying a first electrical signal, a second conductor carrying a second electrical signal different from the first electrical signal, and an insulator surrounding the first conductor and the second conductor along substantially an entire length of the electrical cable, the insulator having an outer surface, the conductor assembly extending along a longitudinal axis for a length of the electrical cable, the conductor assembly having a metal coating layer on the outer surface of the insulator surrounding both the first and second conductors, the coating layer being seamless along the length of the electrical cable and the coating layer being an applied coating layer initially applied to the outer surface to coat the outer surface of the insulator along the length of the electrical cable, the applied coating layer includes developed cracks developed after forming to transform the applied coating layer into a cracked applied coating layer, the cracked applied coating layer separating the applied coating layer into a plurality of disparate coating sections electrically separated by the cracks, the coating layer being conductive defining an inner electrical shield of the electrical cable for the first and second conductors; and a cable shield wrapped around the conductor assembly, the cable shield having an inner edge and an outer edge, the outer edge wrapped over the inner edge to form a flap covering the inner edge and extending along the longitudinal axis, the cable shield engaging a majority of the inner electrical shield and forming an outer electrical shield for the first and second conductors exterior of the inner electrical shield, the outer electrical shield covering the cracks, wherein the cable shield has an elevated segment forming a void at the inner edge, the inner electrical shield being interior of the void, the outer electrical shield being exterior of the void, the outer electrical shield being electrically connected to the inner electrical shield circumferentially around the conductor assembly except at the void.

2. The electrical cable of claim 1, wherein the outer electrical shield engages and is electrically connected to the inner electrical shield.

3. The electrical cable of claim 1, wherein the coating layer conforms to the shape of the insulator around the entire outer surface.

4. The electrical cable of claim 1, wherein the conductor assembly extends along a lateral axis bisecting the first and second conductors and the conductor assembly extends along a transverse axis centered between the first and second conductors, the longitudinal axis, the lateral axis and the transverse axis being mutually perpendicular axes, the coating layer being symmetrical about the lateral axis along the length of the electrical cable and being symmetrical about the transverse axis along the length of the electrical cable.

5. The electrical cable of claim 1, wherein the coating layer is a non-wrapped coating layer forming the seamless coating layer along the length of the electrical cable.

6. The electrical cable of claim 1, wherein the coating layer is homogenous through a thickness of the coating layer.

7. The electrical cable of claim 1, wherein the cable shield includes a conductive layer and a dielectric layer, the conductive layer being interior of the dielectric layer to directly electrically connect to the inner electrical shield.

8. The electrical cable of claim 1, wherein the conductor assembly includes a drain wire between the cable shield and the coating layer, the drain wire being electrically connected to at least one of the cable shield and the coating layer.

9. The electrical cable of claim 1, wherein the conductor assembly includes a seal wrap around the exterior of the cable shield.

10. The electrical cable of claim 1, the outer electrical shield covering the disparate coating sections across the cracks to electrically connect the disparate coating sections.

11. The electrical cable of claim 1, wherein the coating layer includes conductive ink particles applied to the insulator cured to form the coating layer.

12. The electrical cable of claim 1, wherein the coating layer includes metal particles sprayed on the insulator.

13. The electrical cable of claim 1, wherein the coating layer includes metal particles embedded in the outer surface of the insulator.

14. The electrical cable of claim 1, wherein the void is aligned between the first and second conductors to balance skew induced in the first and second conductors by the inclusion of the void.

15. The electrical cable of claim 1, wherein the coating layer is a direct metallization shield structure interior of the cable shield.

16. An electrical cable comprising:
a conductor assembly having a first conductor carrying a first electrical signal, a second conductor carrying a second electrical signal different from the first electrical signal, and an insulator surrounding the first conductor and the second conductor, the insulator having an outer surface, the conductor assembly extending along a longitudinal axis for a length of the electrical cable, the conductor assembly having a coating layer on the outer surface of the insulator surrounding both the first and second conductors, the coating layer being a direct metallization shield structure initially applied directly to the outer surface of the insulator to coat the outer surface of the insulator along the length of the electrical cable, the coating layer being conductive defining an inner electrical shield of the electrical cable, the applied coating layer developing developed cracks after forming to transform the applied coating layer into a cracked applied coating layer in the direct metallization shield structure, the cracked applied coating layer separating the coating layer into a plurality of disparate coating sections electrically separated by the cracks; and a cable shield wrapped around the conductor assembly, the cable shield having an inner edge and an outer edge, the outer edge wrapped over the inner edge to form a flap covering the inner edge and extending along the longitudinal axis, the cable shield engaging a majority of the inner electrical shield and forming an outer electrical shield exterior of the inner electrical shield, the outer electrical shield covering the cracks, wherein the cable shield has an elevated segment forming a void at the inner edge, the inner electrical shield being interior of the void, the outer electrical shield being exterior of the void, the outer electrical shield being electrically connected to the inner electrical shield circumferentially around the conductor assembly except at the void.

17. The electrical cable of claim 16, wherein the outer electrical shield engages and is electrically connected to the inner electrical shield.

18. The electrical cable of claim 16, wherein the outer electrical shield is electrically connected to each of the disparate coating sections and spans across the cracks to electrically connect the disparate coating sections.

19. The electrical cable of claim 16, wherein the void is aligned between the first and second conductors to balance skew induced in the first and second conductors by the inclusion of the void.

20. An electrical cable comprising:
a conductor assembly having a first conductor carrying a first electrical signal, a second conductor carrying a second electrical signal different from the first electrical signal, and an insulator surrounding the first conductor and the second conductor, the insulator having an outer surface, the conductor assembly extending along a longitudinal axis for a length of the electrical cable, the conductor assembly having a coating layer on the outer surface of the insulator surrounding both the first and second conductors, the coating layer being a direct metallization shield structure applied directly to the outer surface of the insulator to initially coat the outer surface of the insulator along the length of the electrical cable, the coating layer includes conductive ink particles applied to the insulator cured to form the coating layer, the coating layer being conductive defining an inner electrical shield of the electrical cable, the applied coating layer includes developed cracks developed after forming to transform the applied coating layer into a cracked applied coating layer, the cracked applied coating layer separating the applied coating layer into a plurality of disparate coating sections electrically separated by the cracks; and a cable shield wrapped around the conductor assembly, the cable shield having an inner edge and an outer edge, the outer edge wrapped over the inner edge to form a flap covering the inner edge and extending along the longitudinal axis, the cable shield engaging a majority of the inner electrical shield and forming an outer electrical shield exterior of the inner electrical shield, the outer electrical shield covering the cracks, wherein the cable shield has an elevated segment forming a void at the inner edge, the inner electrical shield being interior of the void, the outer electrical shield being exterior of the void, the outer electrical shield being electrically connected to the inner electrical shield circumferentially around the conductor assembly except at the void.

21. The electrical cable of claim 20, wherein the outer electrical shield engages and is electrically connected to the inner electrical shield.

22. The electrical cable of claim 20, wherein the void is aligned between the first and second conductors to balance skew induced in the first and second conductors by the inclusion of the void.

* * * * *